United States Patent [19]

Yokoyama

[11] 4,384,261
[45] May 17, 1983

[54] CLASS A COMPLEMENTARY SINGLE-ENDED PUSH-PULL AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 279,251

[22] Filed: Jul. 1, 1981

[30] Foreign Application Priority Data

Jul. 9, 1980 [JP] Japan .................................. 55-93419

[51] Int. Cl.³ ............................................ H03F 3/30
[52] U.S. Cl. ..................................... 330/267; 330/265
[58] Field of Search ................ 330/263, 265, 267, 270

[56] References Cited

U.S. PATENT DOCUMENTS 3,536,958 10/1970 Sondermeyer ...................... 330/263

Primary Examiner—James B. Mullins
Assistant Examiner—Gene Wan
Attorney, Agent, or Firm—Frishauf, Holtz, Goodman & Woodward

[57] ABSTRACT

In a complementary single-ended push-pull amplifier in which emitters of first and second complementary bipolar output transistors are connected through first and second emitter resistors to a load such as a loudspeaker, third and fourth complementary bipolar transistors are connected in series between the bases of the first and second bipolar transistors having their emitters connected to a bias voltage source for operating the first and second output transistors in the Class A mode. The bases of third and fourth transistors are respectively connected to the emitters of the first and second transistors, whereby a negative feedback is provided from the emitters of the first and second transistors to the bases thereof. With this arrangement, the sum of the collector currents of the first and second transistors is kept substantially constant and hence distortion of an output current (difference between the collector currents of the output transistors) fed to the load at large signal levels can be improved.

7 Claims, 6 Drawing Figures

CLASS A COMPLEMENTARY SINGLE-ENDED PUSH-PULL AMPLIFIER

BACKGROUND OF THE INVENTION

The present invention relates to an audio amplifier and, more particularly, to a Class A complementary single-ended push-pull amplifier.

An audio amplifier is known which includes a Class A complementary single-ended push-pull amplifier circuit as an output stage power amplifier for driving a loudspeaker. In FIG. 1, there is shown an arrangement of such an audio power amplifier in which an input signal is applied to an input stage complementary push-pull amplifier circuit comprised of complementary field effect transistors Q1 and Q2. Complementary output signals of the input stage amplifier circuit are amplified by a pre-driver stage complementary push-pull amplifier circuit having complementary bipolar transistors Q3 and Q4 and then are applied to driver-stage complementary bipolar transistors Q5 and Q6. The driver transistors Q5 and Q6 are Darlington-connected to output bipolar transistors Qn and Qp, respectively. An output current Io derived from a connection point between emitter resistors $R_{En}$ and $R_{Ep}$ (of resistance $R_E$) of the output transistors Qn and Qp is fed to a load Rl such as a loudspeaker.

A constant DC voltage source 1 for producing a constant voltage $V_E$ is connected between the bases of the driver transistors Q5 and Q6 to operate the transistors Q5 and Q6, and Qn and Qp in the Class A mode.

Let the collector currents of the transistors Qn and Qp in the above-mentioned circuit be Icn and Icp, respectively. The sum of the currents is given by $$Icn + Icp = [V_E - (V_{be1} + V_{be2} + V_{be3} + V_{be4})]/R_E$$

where $V_{be1}$, $V_{be2}$, $V_{be3}$ and $V_{be4}$ are base-to-emitter voltages of the transistors Q5, Q6, Qn and Qp, respectively.

It is known that the base-to-emitter voltage $V_{be}$-to-collector current Ic characteristics of a bipolar transistor generally exhibit a non-linear characteristics (exponential characteristics) at a rising portion of the collector current Ic. The base-to-emitter voltages $V_{be1}$ and $V_{be2}$ in the above-equation are set in a linear portion of the $V_{be}$-to-Ic characteristics curve, because operation ranges of the transistors Q5 and Q6 are relatively narrow. Since the transistors Qn and Qp operate in a wide range, the voltages $V_{be3}$ and $V_{be4}$ may reach a non-linear portion at large signal levels. Therefore, odd-order harmonic distortion is produced in the output signal.

As shown in FIG. 2 illustrating the output characteristics of the amplifier of FIG. 1, the output current Io=Icn−Icp non-linearly changes as a voltage Vi between the mid point of the DC voltage source 1 and a connection point between the emitter resistors $R_{En}$ and $R_{EP}$ becomes large. Thus, for a large input signal, the odd-harmonic distortion occurs in the output signal.

SUMMARY OF THE INVENTION

Accordingly, an object of the present invention is to provide a Class A complementary single-ended push-pull amplifier which can reduce distortion in an output current supplied to a load, which is caused by the non-linear characteristics of output transistors.

According to the present invention, in a complementary single-ended push-pull amplifier including first and second complementary bipolar output transistors having emitter resistors commonly connected to a load such as a loudspeaker, third and fourth complementary bipolar transistors are connected in series between the bases of the first and second output transistors. The third and fourth transistors have their emitters connected to a bias DC voltage source to operate the first and second output transistors in the Class A mode. The third and fourth transistors have their bases respectively connected to the emitters of the first and second output transistors, whereby a negative feedback from the emitters of the first and second output transistors to the bases thereof is provided so that the sum of output currents of the first and second output transistors is kept substantially constant. Since the sum of the output currents of the first and second output transistors is kept constant, distortion in the output current of the amplifier, particularly at large signal levels, is reduced.

DETAILED DESCRIPTION OF THE PREFERRED EMBODIMENTS

Figure 1:
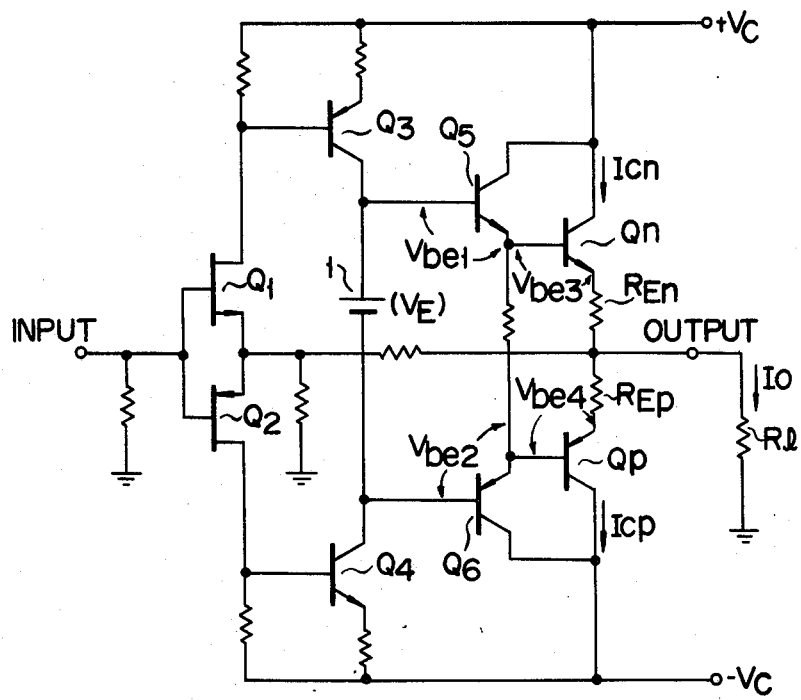
FIG. 1 shows a basic circuit diagram of a prior art Class A complementary single-ended push-pull amplifier.
Figure 2:
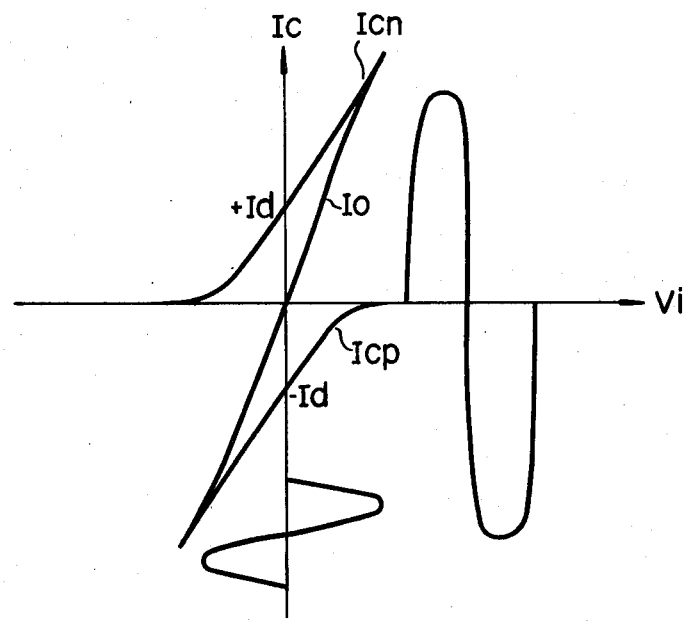
FIG. 2 shows input voltage-to-output current characteristics of the complementary output transistors shown in FIG. 1.
Figure 3:
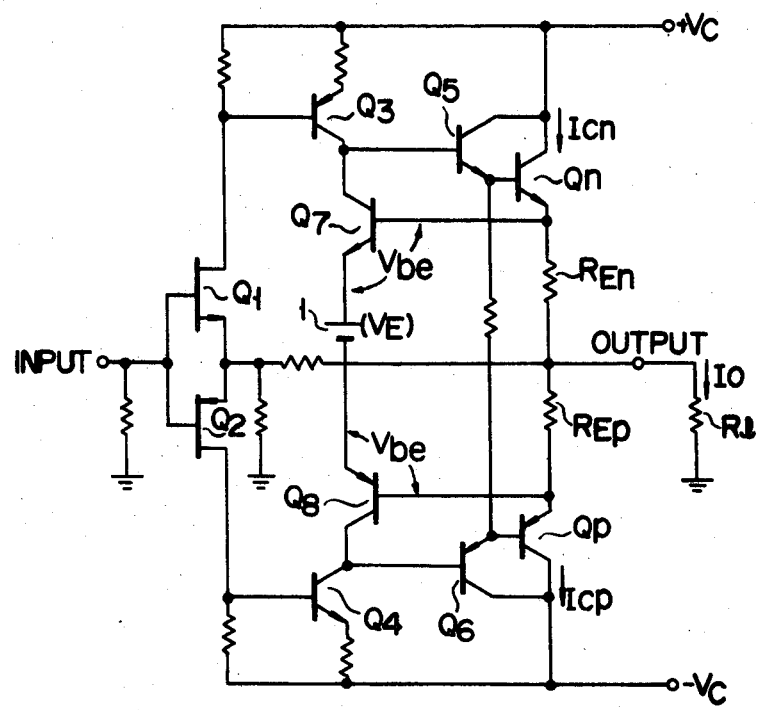
FIG. 3 shows a basic circuit diagram of a Class A complementary single-ended push-pull amplifier embodying the present invention.

Referring now to FIG. 3, there is shown a basic arrangement of a complementary single-ended push-pull amplifier embodying the present invention. In the figure, like symbols are used for designating like portions in the prior art circuit shown in FIG. 1. As easily seen from the drawing, a couple of complementary bipolar transistors Q7 and Q8 with a DC voltage source 1 interposed between the emitters thereof are connected between the bases of transistors Q5 and Q6. More specifically, the NPN transistor Q7 has its base connected to an emitter of a transistor Qn, its collector to a base of the transistor Q5, and its emitter to the positive terminal of the voltage source 1. On the other hand, the PNP transistor Q8 has its base connected to an emitter of a transistor Qp, its collector to a base of a transistor Q6 and its emitter to the negative terminal of the voltage source 1. With this arrangement, the voltage across emitter resistors $R_{En}$ and $R_{Ep}$ are negatively fed back to the bases of the transistors Q5 and Q6. As in the circuit shown in FIG. 1, the DC voltage source 1 has a voltage $V_E$ to cause the transistors Q5, Q6, Qn and Qp to operate in the Class A mode.

Through the action of the negative feedback, the sum of the collector currents Icn and Icp of the transistors Qn and Qp, Icn+Icp, is kept substantially constant. The sum current Icn+Icp is given by $$\text{Icn} + \text{Icp} = (V_E + 2V_{be})/R_E$$

where $V_{be}$ is a base-to-emitter voltage of each of the transistors Q7 and Q8, and is kept constant due to the negative feedback action. An idling current Id of the output transistors Qn and Qp is expressed by $$\text{Id} = (V_E + 2V_{be})/2R_E$$

Figure 4:
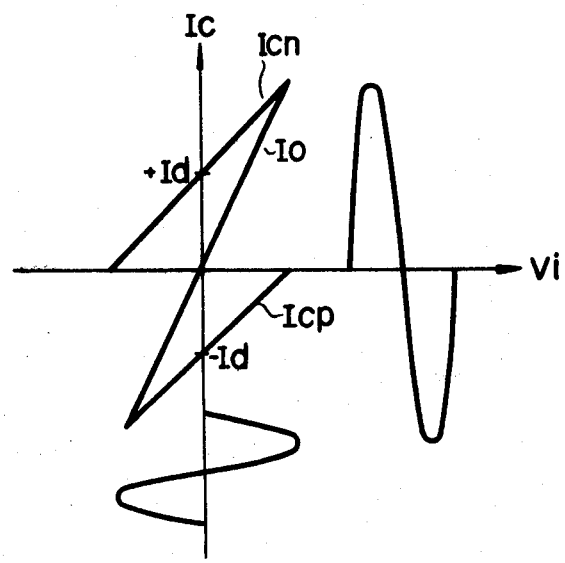
FIG. 4 shows input voltage-to-output current characteristics of the complementary output transistors of FIG. 3.

FIG. 4 shows a graphical representation of a characteristics of the voltage Vi between the mid point of the DC voltage source 1 and the connection point between the emitter resistors $R_{En}$ and $R_{Ep}$-to-the collector currents Icn, Icp. By the action of the negative feedback, the collector currents Icn, Icp are controlled to have a linear characteristic, and an output current Io supplied to a load Rl changes linearly with the changing input signal.

Figure 5:
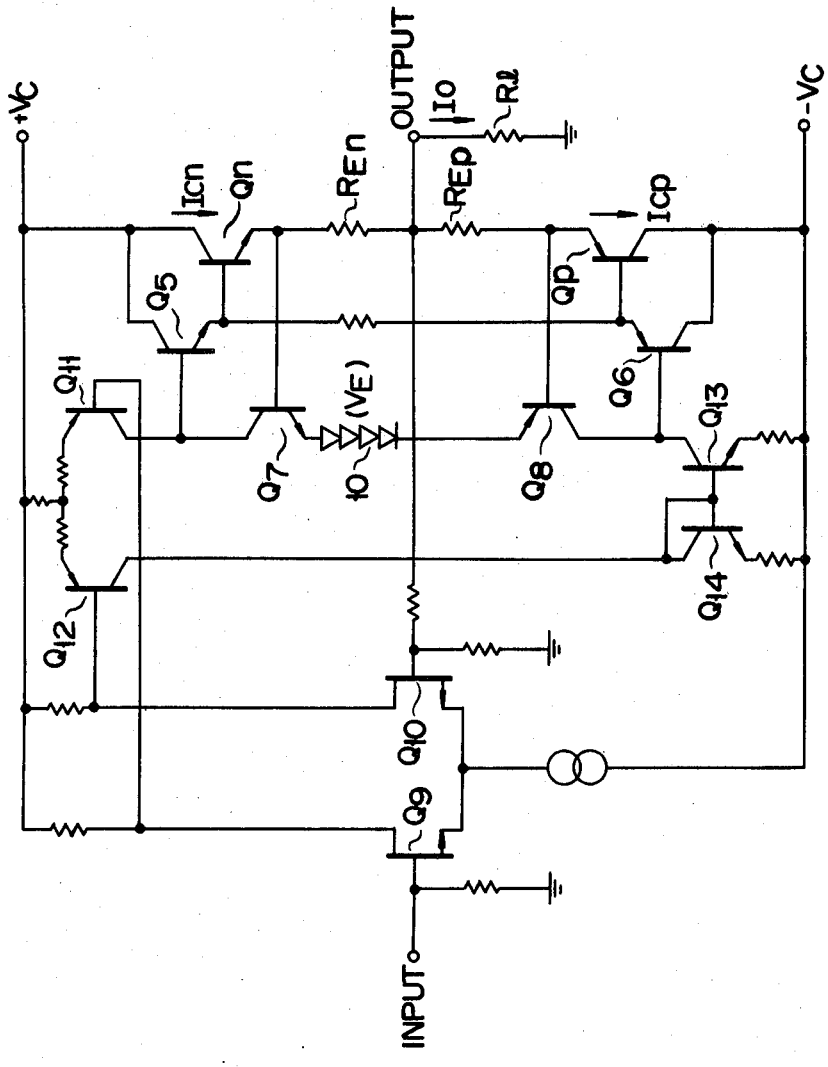
FIG. 5 shows a circuit diagram of another embodiment of a Class A complementary single-ended push-pull amplifier according to the present invention.

FIG. 5 shows another arrangement of a Class A single-ended push-pull amplifier according to the present invention, in which differential amplifiers are used for the input and pre-driver stages. Like symbols are used to designate like portions in the arrangement of FIG. 3. The input stage is comprised of differential field effect transistors Q9 and Q10. The pre-driver stage is comprised of differential bipolar transistors Q11 and Q12 to which a current mirror load comprised of transistors Q13 and Q14 is connected. A transistor Q7, diodes 10 and a transistor Q8 are connected between the transistors Q11 and Q13 which have their collectors connected to bases of transistors Q5 and Q6, respectively. The voltage source 1 in FIG. 3 corresponds to the diodes 10 in the present embodiment. The diodes 10 may be substituted by a Zener diode.

Figure 6:
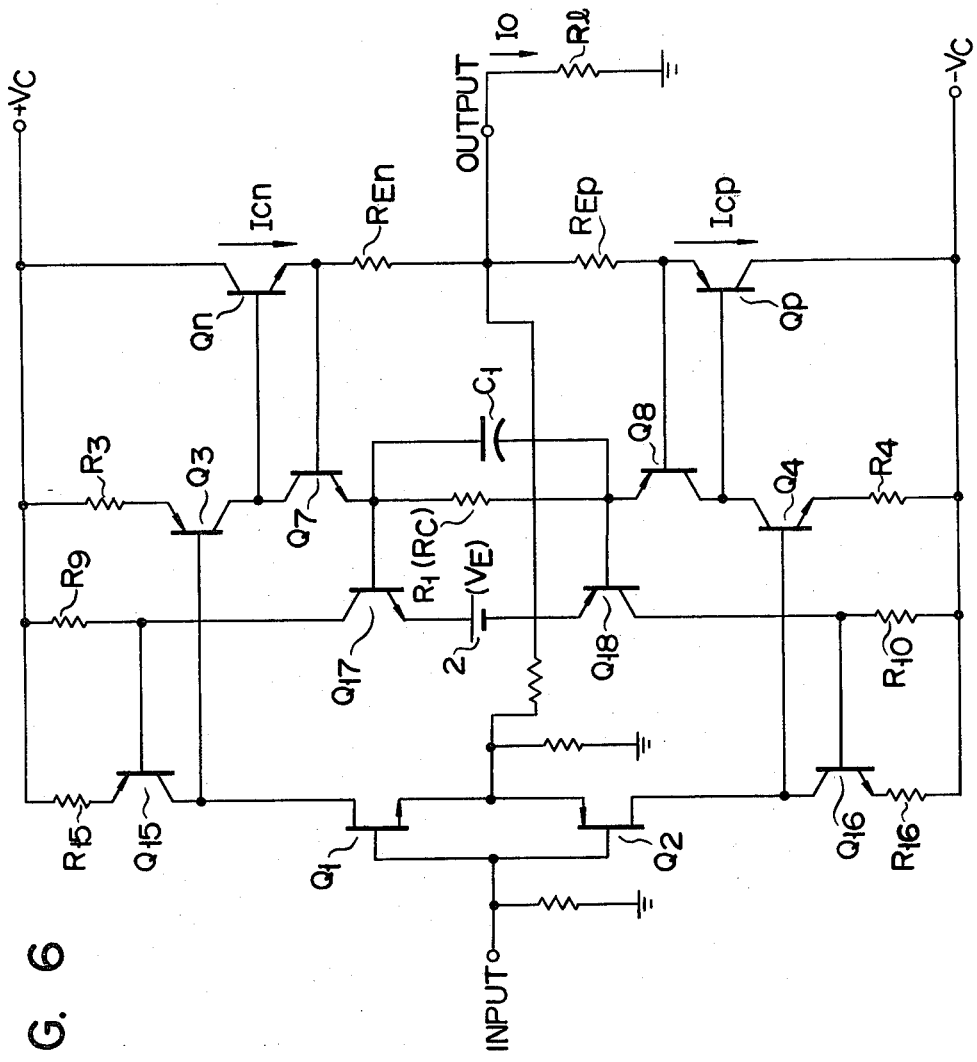
FIG. 6 shows a circuit diagram of yet another embodiment of a Class A complementary single-ended push-pull amplifier according to the present invention.

FIG. 6 shows yet another embodiment of the present invention which is designed aiming at improvement of a gain of the first stage. Like symbols are used to designate like portions in the arrangement of FIG. 3.

A drain of a first stage transistor Q1 is connected to a positive power source +Vc via a transistor Q15 and a resistor R15. A drain of a transistor Q2 is connected to a negative power source −Vc through a transistor Q16 and a resistor R16. The drains of the transistors Q1 and Q2 are respectively connected to bases of driver transistors Q3 and Q4. The emitters of the transistors Q3 and Q4 are connected to the power sources +Vc and −Vc, through resistors R3 and R4, respectively. The collectors of the transistors Q3 and Q4 are connected to each other via transistors Q7 and Q8 with a resistor R1 (of resistance Rc) interposed between the emitters thereof. The capacitor C1 is connected across the resistor R1.

Complementary transistors Q17 and Q18 are connected to each other at the emitters with a DC voltage source 2 (of voltage $V_E$) inserted therebetween. The transistors Q17 and Q18 have their bases connected to both ends of the resistor R1 and their collectors to the bases of the transistors Q15 and Q16, respectively. The collectors of the transistors Q17 and Q18 are connected to the power sources +Vc and −Vc through resistors R9 and R10, respectively.

The collectors of the transistors Q3 and Q4 are connected to the bases of the output transistors Qn and Qp, respectively. The voltage across emitter resistors $R_{En}$ and $R_{Ep}$ of the transistors Qn and Qp are respectively fed back to the bases of the transistors Qn and Qp through the transistors Q7 and Q8.

As in the embodiment shown in FIG. 3, based on a negative feedback action, the output currents of the transistors Qn and Qp are controlled by the transistors Q7 and Q8 so that the sum of collector currents, Icn+Icp is constant and is given by $$\text{Icn} + \text{Icp} = (\text{Ie} \cdot \text{Rc} + 2V_{be})/R_E$$

where $V_{be}$ represents a base-to-emitter voltage of each of the transistors Q7 and Q8 and Ie represents an emitter current of each of the transistors Q3 and Q4. Therefore, distortion at large signal levels is reduced.

In the above equation, the emitter current Ie of each of the transistors Q3 and Q4 is given by $$\text{Ie} = (V_E + 2V_{be})/\text{Rc}$$

where $V_{be}$ represents a base-to-emitter voltage of each of the transistors Q17 and Q18, and is kept constant due to the negative feedback action.

The idling current of each of the output transistors Qn and Qp is expressed by $$\text{Id} = (\text{Ie} \cdot \text{Rc} + 2V_{be})/2R_E$$

where $V_{be}$ represents the base-to-emitter voltage of each of the transistors Q7 and Q8. The current Id is rendered constant by the constant current Ie and the constant base-to-emitter voltage $V_{be}$.

In the embodiment as mentioned above, when the voltage across the resistor R1 increases due to a variation of the power source voltage or the like, the voltage increase is compensated in the following manner. When the voltage across the resistor R1 increases, the collector current of the transistor Q17 increases to decrease the base potential of the transistor Q15. As a result, the collector current of the transistor Q15 increases. The increase in the collector current of the transistor Q15 decreases the base current and the collector current of the transistor Q3. The collector current of the transistor Q3 and therefore the emitter current of the transistor Q7 decrease. Therefore, the voltage across the resistor R1 is lowered. Through the feedback loop, the voltage across the resistor R1 is stabilized. The principle of the operation is correspondingly applicable for a case that the voltage across the resistor R1 reduces. In this way, operating points of the transistors Qn and Qp are stabilized.

The combination of the transistor Q15 and the resistors R9 and R15 serves as a constant current load circuit for the drain of the transistor Q1. On the other hand, the combination of the transistor Q16, and the resistors R10 and R16 serves as a constant current load circuit for the drain of the transistor Q2. Accordingly, the drain loads of the transistors Q1 and Q2 consist of only input impedances of the common-emitter transistors Q3 and Q4, respectively, and therefore the gain of the input stage increases.

What is claimed is:

1. A complementary single-ended push-pull amplifier comprising:
   first and second complementary bipolar transistor means;
   first and second emitter resistors connected in series between emitters of said first and second complementary bipolar transistor means, a connection point between said emitter resistors being adapted for connection to a load;

third and fourth complementary bipolar transistors connected in series between bases of said first and second transistor means and having their bases connected to the emitters of said first and second transistors, respectively;

a constant voltage circuit connected between the emitters of said third and fourth transistors to operate said first and second transistor means in the Class A mode;

said third and fourth transistors comparing a voltage across said first and second emitter resistors with a voltage of said constant voltage circuit; and collector currents of said third and fourth transistors controlling base biases of said first and second transistor means, to thereby operate said first and second transistor means so that a sum of collector currents of said first and second transistor means is kept substantially constant.

2. A complementary single-ended push-pull amplifier according to claim 1, further comprising:

driver stage circuit means for driving said first and second transistor means; and said driver stage circuit means being comprised of a complementary push-pull amplifying circuit driving the bases of said first and second transistor means.

3. A complementary single-ended push-pull amplifier according to claim 1, further comprising:

driver stage circuit means for driving said first and second transistor means; and said driver stage circuit means being comprised of a differential amplifying circuit having a current mirror load.

4. A complementary single-ended push-pull amplifier according to claim 1, further comprising driver stage circuit means for driving said first and second transistor means having constant current load means whose current value is controlled by said collector currents of said third and fourth transistors.

5. A complementary single-ended push-pull amplifier according to claim 4, further comprising:

driver stage circuit means for driving said first and second transistor means; and said driver stage circuit means being comprised of a complementary push-pull amplifying circuit driving the bases of said first and second transistor means.

6. A complementary single-ended push-pull amplifier according to claim 5, further comprising:

fifth and sixth complementary bipolar transistors having respective bases connected to the emitters of said third and fourth transistors, respective emitters connected to each other by said constant voltage circuit, and respective collectors connected to said constant current load means; and a resistor and a capacitor each connected between the bases of said fifth and sixth transistors.

7. A complementary single-ended push-pull amplifier according to any one of claims 1 to 6, wherein said first and second transistor means are comprised of Darlington-connected transistor pairs, respectively.

* * * * *